(12) United States Patent
Boardman et al.

(10) Patent No.: US 12,453,271 B2
(45) Date of Patent: Oct. 21, 2025

(54) FOLDABLE DISPLAY DEVICE

(71) Applicant: Sharp Display Technology Corporation, Kameyama (JP)

(72) Inventors: Edward Andrew Boardman, Kameyama (JP); Takehiro Murao, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 361 days.

(21) Appl. No.: 18/210,855

(22) Filed: Jun. 16, 2023

(65) Prior Publication Data

US 2024/0008344 A1    Jan. 4, 2024

Related U.S. Application Data

(60) Provisional application No. 63/357,982, filed on Jul. 1, 2022.

(51) Int. Cl.
  *G09F 9/30* (2006.01)
  *H10K 59/40* (2023.01)
  *H10K 59/80* (2023.01)
  *H10K 102/00* (2023.01)

(52) U.S. Cl.
  CPC ............. *H10K 59/87* (2023.02); *H10K 59/40* (2023.02); *H10K 59/8793* (2023.02); *H10K 2102/311* (2023.02)

(58) Field of Classification Search
  CPC .... H10K 59/87; H10K 59/40; H10K 59/8793; H10K 2102/311; H10K 77/111; G09F 9/301; G09F 9/335
  See application file for complete search history.

(56) References Cited

U.S. PATENT DOCUMENTS

| | | | |
|---|---|---|---|
| 9,978,965 B2 | 5/2018 | Hack et al. | |
| 10,622,581 B2 | 4/2020 | Hu et al. | |
| 2010/0053493 A1* | 3/2010 | Kuwajima | G02B 6/0073 349/58 |
| 2016/0029104 A1 | 1/2016 | Kreth et al. | |
| 2020/0262746 A1 | 8/2020 | He et al. | |
| 2021/0027665 A1 | 1/2021 | Huang et al. | |
| 2022/0005877 A1* | 1/2022 | Seo | H10K 71/135 |

\* cited by examiner

*Primary Examiner* — Donald L Raleigh
(74) *Attorney, Agent, or Firm* — ScienBiziP, P.C.

(57) ABSTRACT

A foldable display device includes a plurality of layers bonded to each other. The plurality of layers includes a light emitting diode substrate layer, a cover window layer including a window film through which light from a first surface of the light emitting diode substrate layer is emitted, a shock-absorber layer located on a second surface of the light emitting diode substrate layer. The second surface is a surface opposite to the first surface. A dimension of the light emitting diode substrate layer measured along a folding axis is larger than a dimension of at least one layer in the plurality of layers.

8 Claims, 7 Drawing Sheets

FOLDABLE DISPLAY DEVICE

TECHNICAL FIELD

The present disclosure relates to structures of display devices. It is particularly applicable to foldable, rollable or flexible display devices based on light emitting diodes (LED), for example an organic LED (OLED) display.

BACKGROUND ART

An information display device may include a stack of layers, for example a matrix of organic light emitting diodes (OLEDs) disposed on a substrate, a touch sensor, and an optical polarizer. These layers may be bonded together using adhesive. A cover window may be bonded to the viewing side of the display device, through which light is emitted, while the cover window provides protection to the layers of the display. A shock absorber may be further bonded to the non-viewing side of the display device, which provides additional protection to the display device in case of impact by an external object on the display device. The display may further be mounted into a housing, which typically supports the display device and provides protection to the layers of the display device around the edges of the display device.

Information display devices may be foldable, such that their shape is changed repeatedly during their use. For example, foldable displays may be bent or folded such that at least some part of the display has a curvature at some times and is substantially flat at other times. For foldable displays, it is a requirement that the cover window can be deformed without failing (e.g. failing by cracking or yielding) and without requiring a high force to cause the deformation. Typically this requires that the window is thin and/or comprised of a material with low stiffness. For example, polymer materials may be a suitable window film or glass windows with thickness below 100 μm may be suitable. In display devices which are non-bendable (i.e. the shape of the display is not changed repeatedly during their use), it is common to use a relatively thick glass window (e.g. thickness 400 μm to 700 μm).

Furthermore, the shock absorber typically includes a thin layer of a material with a very high stiffness compared to the other layers of the display device. For example, a layer of stainless steel with a thickness less than 50 μm may be suitable for including in a shock absorbing layer. The cover window and shock absorber, having the highest stiffness and being located on the outer surfaces of the foldable display device, are at particular risk of delamination due to adhesive failure. Delamination results in significant changes in the optical and physical properties of the display device, which may render the display device unusable. Therefore, it is desirable to reduce the likelihood of delamination occurring in the display device during the folding or unfolding process.

Patent Literature 1 discloses a display device having functional panels attached thereto. The display device of the patent literature 1 has an adhesive enhancement layer contacting a side of the polarizing layer and enhancing adhesion between the first adhesive layer and the polarizing layer, thereby avoiding delamination of the polarizing layer from a functional panel, which prone to occur due to an external force, such as movement or impact.

CITATION LIST

Patent Literature

[Patent Literature 1]
US2016/029104A1

SUMMARY

Technical Problem

The structure disclosed in the patent literature 1 may work effectively in a case of non-foldable flat display device. In a case of foldable display device, however, it is required that stress to respective functional panels is reduced by causing shear deformation in OCA (Optical Clear Adhesive) or OCR (Optical Clear Resin). The adhesive enhancement layer of the patent literature 1 may prevent the shear deformation of the OCA or OCR.

An example aspect of the present disclosure is attained in view of the problem, and an example object is to provide a structure of a foldable display device with improved robustness against delamination.

Solution to Problem

In order to attain the object described above, a foldable display device according to an aspect of the present disclosure comprises a plurality of layers, the layers being bonded each other. The plurality of layers includes: a light emitting diode substrate layer; a cover window layer including a window film through which light emitted from a first surface of the light emitting diode substrate layer; a shock-absorber layer located on a second surface of the light emitting diode substrate layer, the second surface being a surface opposite to the first surface, wherein a dimension of the light emitting diode substrate layer measured along a folding axis is larger than a dimension of at least one layer included in the plurality of layers.

Advantageous Effects of Invention

According to an aspect of the present disclosure, it is possible to provide a structure of a foldable display panel with improved robustness against delamination.

DESCRIPTION OF EMBODIMENTS

The following description contains specific information pertaining to example embodiments in the present disclosure. The drawings in the present disclosure and their accompanying detailed description are directed to merely example embodiments. In the following descriptions, the same reference numerals are given to the same constituent members which have the same names and functions. On this account, details of the same constituent members may not be repeatedly described.

First Example Embodiment

In the following, a structure for a foldable display device with the dimensions of the layers to improve the robustness of the foldable display device against delamination is disclosed. The foldable display device includes at least a display substrate, or a light emitting diode substrate such as an organic light emitting diode (OLED) substrate. The OLED includes a flexible insulating-substrate, and an inorganic barrier layer formed over the flexible insulating-substrate, and a thin film transistor (TFT) layer formed over the inorganic barrier layer. The OLED including pixels (e.g., arrays or OLED subpixels) of the display may be operable as an active matrix display by way of a thin film transistor (TFT) backplane (e.g., controlling emission from each subpixel).

The foldable display device may further include at least one of: a single-layer or multilayer shock absorber (e.g. ≈30 μm stainless steel, optionally bonded to a soft polymer such as acrylic foam ≈100 μm thick), an additional lamination layer to add rigidity to the OLED substrate (e.g. a polymer film ≈50 μm thick), a touch sensor (e.g. a projected capacitive type touch sensor), an optical polarizer (e.g. a circular polarizer) and a cover window (e.g. a polymer film ≈100 μm thick) which may be joined to each other and to the display substrate by adhesive layers (e.g. optically clear adhesive, OCA).

First, a structure common to foldable display devices is explained with reference to FIG. 1A, FIG. 1B, and FIG. 3.

Figure 1A:
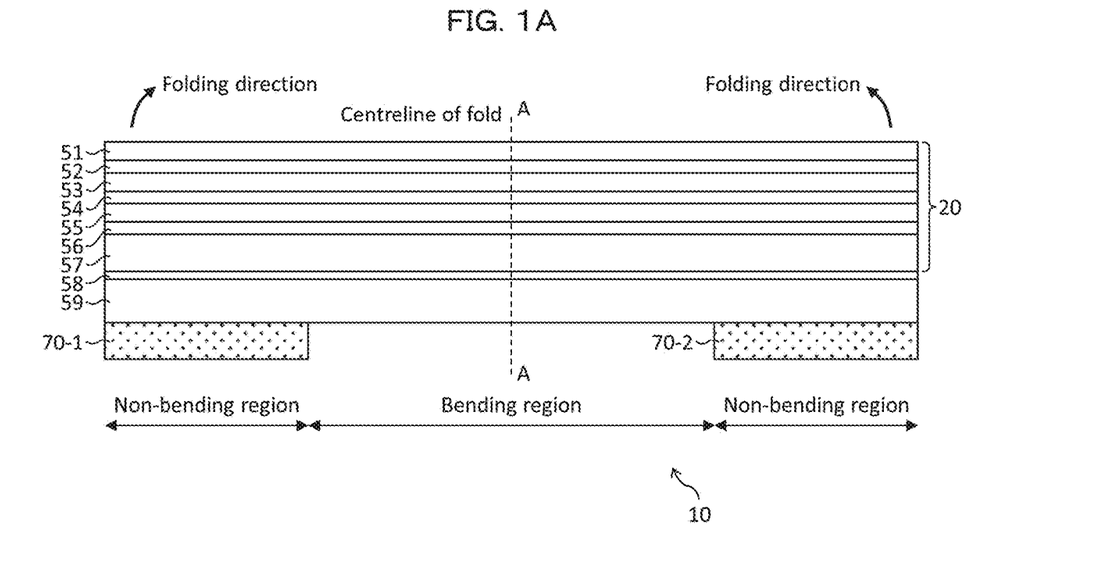
FIG. 1A is a drawing illustrating a side view of a foldable display device 10 in a flat shape.

FIG. 1A illustrates a side view of a foldable display device 10 according to the present disclosure in a flat shape. FIG. 1B illustrates a side view of a foldable display device 10 according to the present disclosure in a folded shape, where the foldable display device 10 is folded along the center line of fold illustrated as a dashed line A-A in FIG. 1A and FIG. 1B. The arrows shown in FIG. 1A indicate the folding direction when the foldable display device 10 is folded. A plurality of layers are stacked in the foldable display device 10 as shown in FIG. 1A.

Figure 1B:
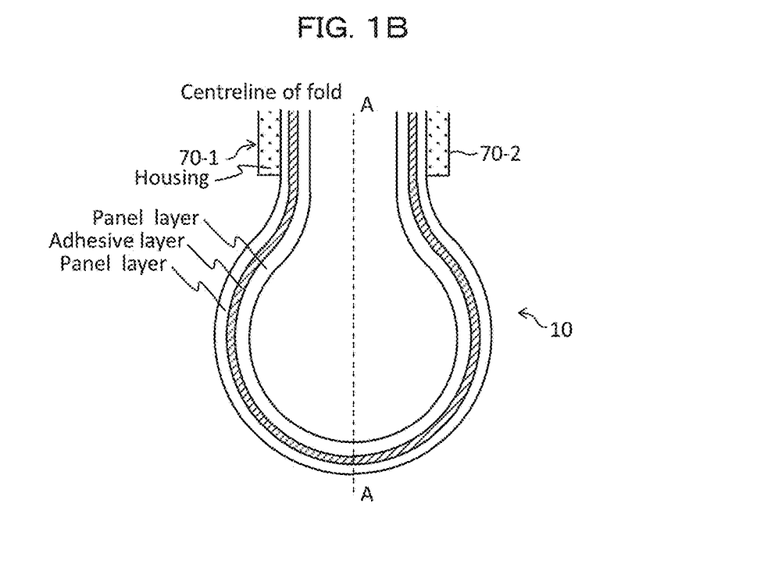
FIG. 1B is a drawing illustrating a side view of a foldable display device 10 in a folded shape.

The side views of FIG. 1A and FIG. 1B are obtained when the foldable display device 10 is viewed along the axis of folding rotation.

Figure 2:
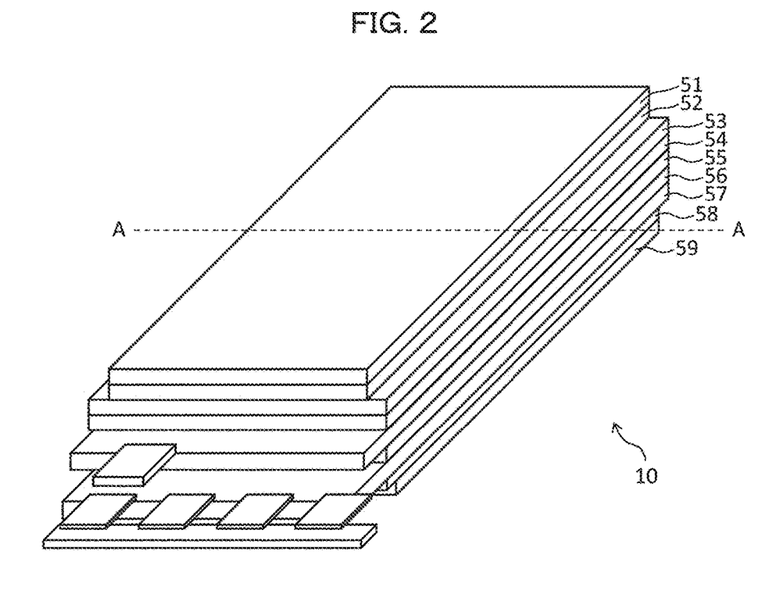
FIG. 2 is a drawing illustrating a perspective view of a foldable display device 10.

FIG. 2 illustrates a perspective view of the foldable display device 10. The line A-A corresponds to the center line of fold. The center line of fold may be simply referred to as the center line of the foldable display device 10.

Figure 3:
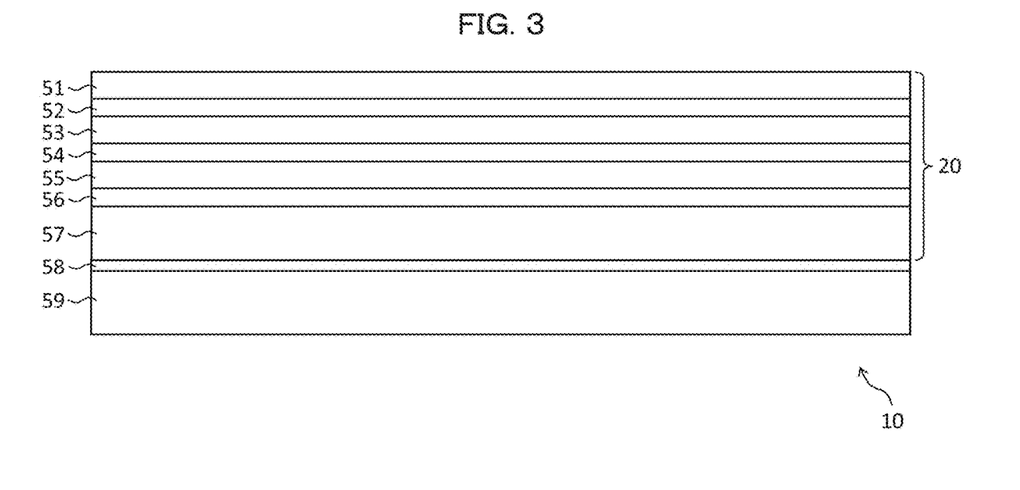
FIG. 3 is a drawing illustrating a cross-sectional view through the center line of FIG. 1A.

FIG. 3 illustrates a cross-sectional view through the center line of the foldable display device 10. The cross-sectional view of FIG. 3 is obtained when the foldable display device 10 is viewed along an axis perpendicular to the axis of folding rotation. In FIG. 3, a length or width in a horizontal direction corresponds to a dimension measured along a folding axis of the foldable display device 10.

A preferred example of the sequence of the stacked layers is shown in FIG. 1A. As shown in FIG. 1A, housing members 70-1 and 70-2 are attached to a shock absorber 59. The shock absorber 59 is bonded to an OLED substrate 57, which may include an additional lamination layer, by means of an adhesive layer 58. Also a touch sensor 55 is bonded to the OLED substrate 57 by means of an adhesive layer 56. An optical polarizer 53 is bonded to the touch sensor 55 by means of an adhesive layer 54. A cover window 51 is bonded to the optical polarizer 53 by means of an adhesive layer 52. The layers of the cover window 51 to the display substrate 57 forms a display panel 20.

In FIG. 1A, the upper surface of the cover window 51 corresponds to a viewing surface of the foldable display device 10. The cover window 51 includes a window film through which light emitted. The upper surface of the OLED substrate 57, to which the touch sensor 55 is bonded by the adhesive layer 56, corresponds to a light emitting surface (first surface) from which the light is emitted. The shock absorber 59 is located on a surface (second surface) opposite to the light emitting surface of the OLED substrate 57.

In FIG. 1B, the stacked layers are illustrated in a simplified manner. That is, the shock absorber 59, the OLED substrate 57, the touch sensor 55, the optical polarizer 53, and the cover window 51 are illustrated as panel layers, while the adhesive layers 58, 56, 54, and 52 are collectively illustrated as an adhesive layer. Although only two panel layers and only one adhesive layer are shown in FIG. 1B, more panel layers and adhesive layers may exist in reality.

The foldable display device 10 includes at least one folding region (e.g. a hinge region of a foldable display) and includes one or more non-folding regions (e.g. an always-planar region of a foldable display). In FIG. 1A and FIG. 1B, the non-folding region corresponds to the region covered by the housing members 70-1 and 70-2 while the remaining region corresponds to the folding region.

During folding the foldable display device 10 adopts a curved shape, such as an arc, in the folding region. A layer placed on the inner surface of the arc in the folding region has a smaller perimeter length compared to a layer placed on the outer surface of the arc. If the layers were not bonded together then respective layers would freely slide past one another to accommodate this difference in length, resulting in slip at the edge of the arc. However, because the layers are bonded together, for example using an optically clear adhesive (OCA), there is some resistance to this movement of the panel layers over one another.

When the foldable display device 10 is folded, the folded shape has an inward folding region, where the uppermost layer is on the inside of the bend, and an outward folding region, where the lowermost layer is on the inside of the bend.

Figure 4:
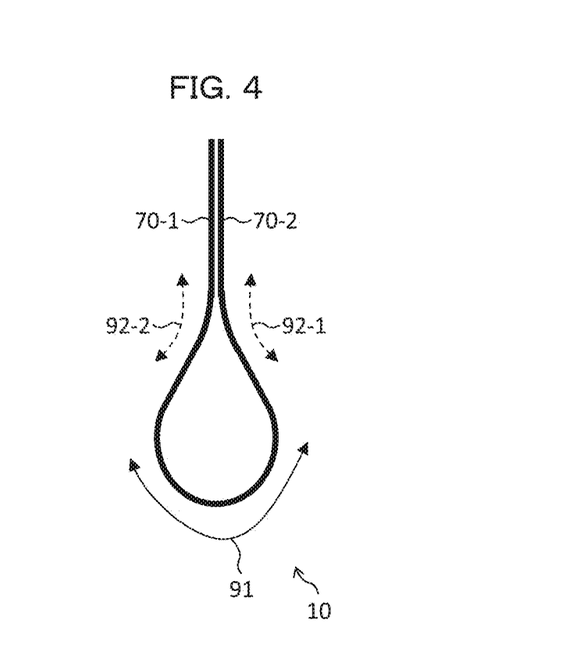
FIG. 4 is a drawing for explaining the inward folding region and the outward folding region.

FIG. 4 is a drawing for explaining the inward folding region and the outward folding region. In FIG. 4, the plurality of stacked layers are not illustrated one by one but correctively illustrated. In FIG. 4, the region of a solid arrow 91 corresponds to the inward folding region, while the region of dashed arrows 92-1 and 92-2 correspond to the outward folding region. As shown in FIG. 4, the outward folding regions are respectively formed near by the housing members 70-1 and 70-2.

Figure 5:
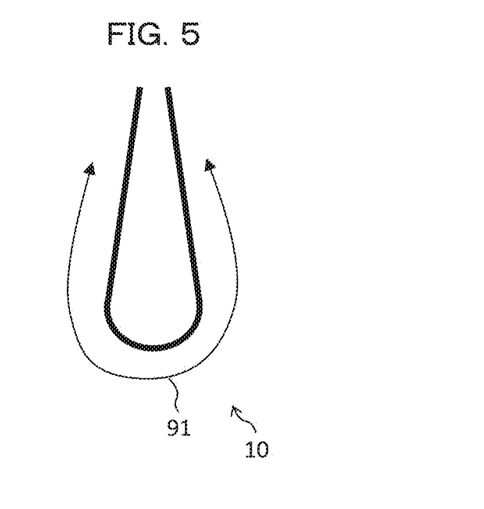
FIG. 5 is a drawing for explaining a folded shape referred to as U-shape.

The folded shape shown in FIG. 4 is referred to as a teardrop-shape. As explained above, the tear drop shape includes the inward folding region and the outward folding region, which causes the stress to the interfaces of the respective panel layers to be more complex in comparison to so called U-shape. For reference, a folded shape referred to as U-shape is illustrated in FIG. 5. As shown in FIG. 5, only inward folding region corresponding to the region of a solid arrow 91 is included in the U-shape, and no outward folding region is included.

For the foldable display device 10, the above described resistance to the movement of the panel layers increases the tendency of the layers to delaminate in the outward folding region. When adhesive is included between the panel layers the slip between the panel layers is constrained, and the interaction between the layers due to the adhesive increases stress, thereby generating a pressure acting normal to the interfaces between the panel layers which acts to peel the layers apart.

Furthermore, near the edge of the foldable display device the plurality of layers also bend along an axis perpendicular to the axis of folding rotation during bending. This additional bending leads to the peeling pressure being highest at the edge of the foldable display device and means that delamination will begin at the edge of the display.

The present disclosure enables the foldable display device 10 to have a reduced peeling pressure for the interfaces which are most at risk from delamination due to either having the highest peeling pressure or the lowest adhesion.

A foldable display device according to the present disclosure has panel layers which are not equal width. This results in an offset between the panel layers at the edge of the foldable display device. The effect of an offset at the panel edge on the interface contact pressure is demonstrated using finite element analysis. Folding from a flat state to a fully folded state of a simple three dimensional model of three panel layers bonded by a hyperelastic OCA was simulated and the peak peeling pressure calculated.

Figure 6:
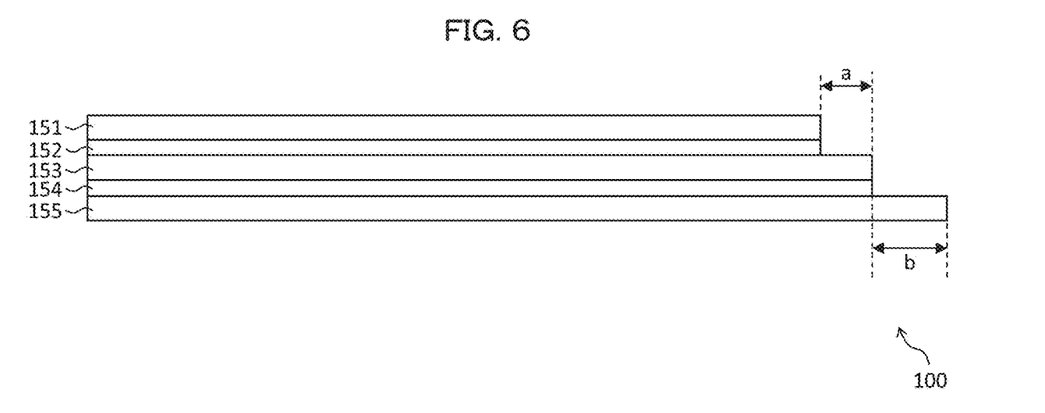
FIG. 6 is a drawing illustrating a cross-sectional view through a centerline of a foldable display device 100.

FIG. 6 illustrates a cross-sectional view through a centerline of a foldable display device 100 according to the present disclosure. The foldable display device 100 can be folded in the teardrop-shape along the centerline. In FIG. 6, a length or width in a horizontal direction corresponds to a dimension measured along a folding axis of the foldable display device 100.

In FIG. 6, the stacked layers are illustrated in a simplified manner. That is, for the sake of simplicity, only three panel layers 151, 153, and 155 as well as only two adhesive layers 152 and 154 are shown. As shown in FIG. 6, the foldable display device 100 has panel layers which are not equal width. This results in an offset between the panel layers at the edge of the foldable display device.

In FIG. 6, the panel layer 151 and adhesive layer 152 have smaller width than the width of the panel layer 153 and the adhesive layer 154. The panel layer 153 and the adhesive layer 154 have smaller width than the width of the panel layer 155. Thus, according to the present disclosure, the foldable display device 100 has an offset between the layers included in the foldable display device 100. The effect of an offset at the edge of the foldable display device 100 on the interface contact pressure is demonstrated using finite element analysis as shown in FIG. 7 and FIG. 8.

Figure 7:
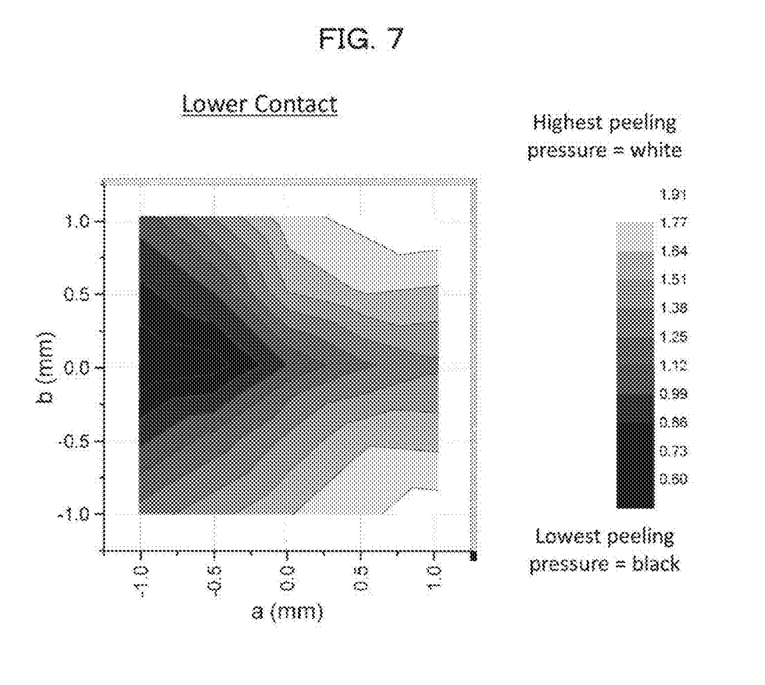
FIG. 7 is a contour diagram obtained by plotting the peeling pressure on the lower interface.
Figure 8:
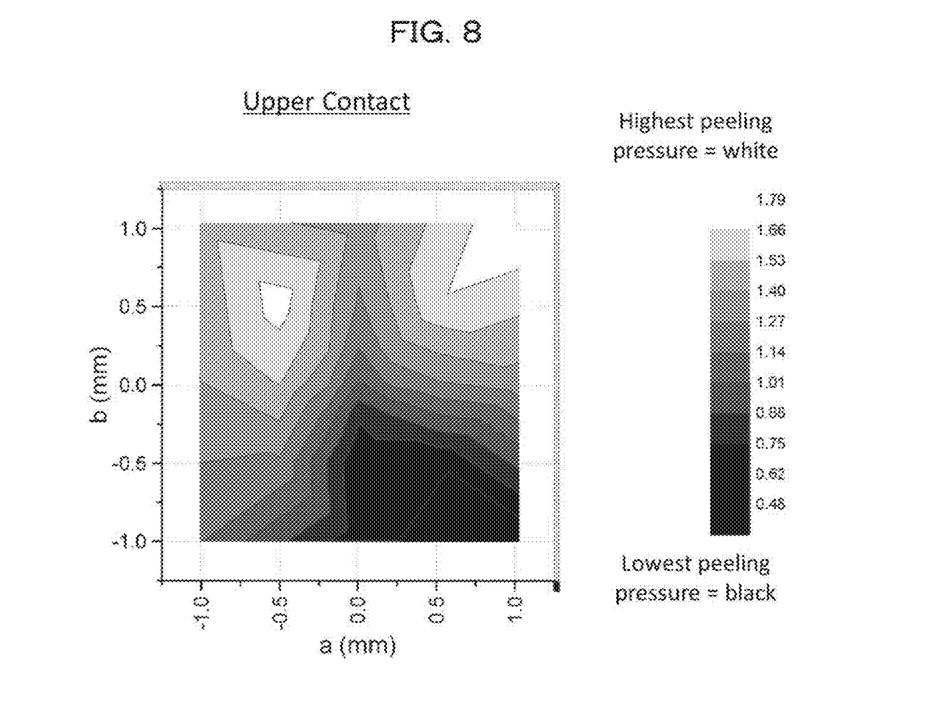
FIG. 8 is a contour diagram obtained by plotting the peeling pressure on the upper interface.

In FIG. 7 and FIG. 8, folding from a flat state to a fully folded state of a simple three dimensional model of three panel layers 151, 153, and 155 bonded by a hyperelastic OCA, which corresponds to adhesive layers 152 and 154, was simulated, and the peak peeling pressure calculated. The effect of the offset relative to the middle layer, which corresponds to the panel layer 153, on the upper and the lower interfaces is shown in the contour plots of FIG. 7 and FIG. 8.

FIG. 7 is a contour diagram obtained by plotting the peeling pressure on the lower interface, which is an interface between the panel layer 153 and the panel layer 155. In this case, the adhesive layer 154 is put in the lower interface. In FIG. 7, the horizontal axis represents the offset length of "a" (mm), and the vertical axis represents the offset length of "b" (mm). In FIG. 7, the highest peeling pressure is shown in white, and the darker the color, the less peeling pressure is applied. The lowest peeling pressure is shown in black.

FIG. 8 is a contour diagram obtained by plotting the peeling pressure on the upper interface, which is an interface between the panel layer 153 and the panel layer 151. In this case, the adhesive layer 152 is put in the upper interface. In FIG. 8, the horizontal axis represents the offset length of "a" (mm), and the vertical axis represents the offset length of "b" (mm). In FIG. 8, the highest peeling pressure is shown in white, and the darker the color, the less peeling pressure is applied. The lowest peeling pressure is shown in black.

As shown in FIG. 6, the offset length "a" means an offset of the upper layer, which corresponds to the panel layer 151. In other words, the offset length "a" is a difference of the width between the panel layer 153 (middle layer) and the panel layer 151 (upper layer). In a case where the offset length "a" is a negative value, the width of the panel layer 151 is smaller than the width of the panel layer 153. In a case where the offset length "a" is a positive value, the width of the panel layer 151 is larger than the width of the panel layer 153.

The offset length "b" means an offset of the lower layer, which corresponds to the panel layer 155. In other words, the offset length "b" is a difference of the width between the panel layer 153 (middle layer) and the panel layer 155 (lower layer). In a case where the offset length "b" is a negative value, the width of the panel layer 155 is smaller than the width of the panel layer 153. In a case where the offset length "b" is a positive value, the width of the panel layer 155 is larger than the width of the panel layer 153.

According to the calculation result shown in FIG. 7 and FIG. 8, a negative offset of the upper layer advantageously decreases the peeling pressure for the upper OCA (adhesive layer 152) but also increases the peeling pressure for the lower OCA (adhesive layer 154). Conversely, a negative offset of the lower layer advantageously decreases the peeling pressure for the lower OCA (adhesive layer 154) but also increases the peeling pressure for the upper OCA (adhesive layer 152).

Therefore, the foldable display device 100 is configured such that a layer adjacent to an interface which has the lowest adhesion or highest peeling pressure is cut to be smaller than other layers of the foldable display device 100, giving an offset between the layers at the edge of the foldable display device 100. The above described configuration of the foldable display device 100 advantageously reduces the peeling pressure at the interface most prone to failure, transferring the peeling pressure to interfaces that can withstand peeling more easily.

For example, in a case where the adhesive layer 152 has less adhesive quality, the width of the panel layer 151 should be larger than the width of the panel layer 153 by 0.5 to 1 mm while the width of the panel layer 155 should be smaller than the width of the panel layer 153 by 0.5 to 1 mm. Thus, the peeling pressure on the upper interface can be reduced as shown in FIG. 8.

For example, in a case where the adhesive layer 154 has less adhesive quality, the width of the panel layer 151 should be smaller than the width of the panel layer 153 by 0.5 to 1 mm while the width of the panel layer 155 should be almost equal to the width of the panel layer 153. Thus, the peeling pressure on the lower interface can be reduced as shown in FIG. 7.

In the reality, the offset may be applied to multiple layers if there is more than one interface which is at high risk of peeling failure. In the following, more specific cases will be discussed in detail.

Second Example Embodiment

In the following, a second example embodiment according to the present disclosure is described with reference to the drawings.

Figure 9:
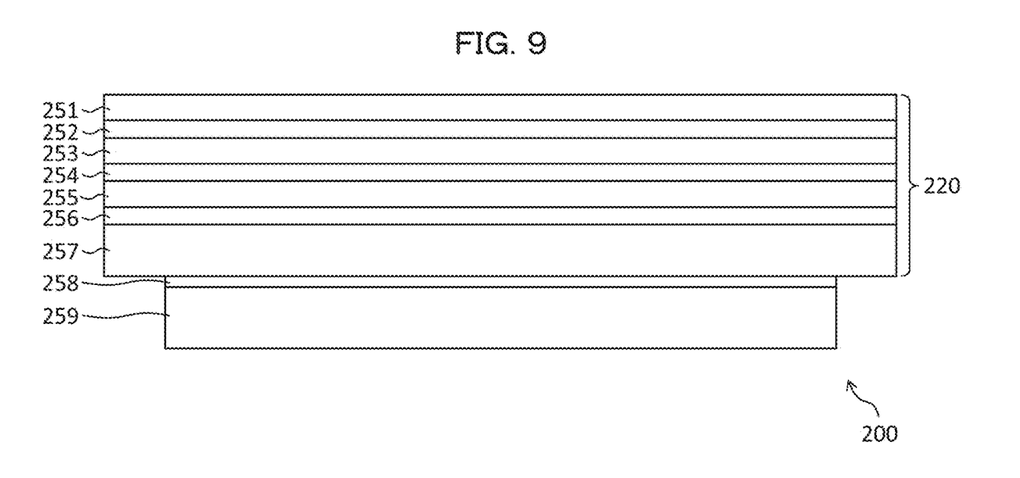
FIG. 9 is a drawing illustrating a cross-sectional view through a centerline of a foldable display device 200.

In this embodiment, a foldable display device 200, which has a smaller shock absorber, is described with reference to FIG. 9. FIG. 9 illustrates a cross-sectional view through a centerline of a foldable display device 200 according to the present disclosure. The foldable display device 200 includes a display panel 220, and the foldable display device 200 can be folded, along the centerline, in the teardrop-shape. In FIG. 9, a length or width in a horizontal direction corresponds to a dimension measured along a folding axis of the foldable display device 200.

A plurality of layers are stacked in the foldable display device 200 as shown in FIG. 9. The foldable display device 200 includes a cover window 251, an adhesive layer 252, an optical polarizer 253, an adhesive layer 254, a touch sensor 255, an adhesive layer 256, an OLED substrate 257, an adhesive layer 258 and a shock absorber 259. The cover window 251 to the shock absorber 259 respectively correspond to the cover window 51 to the shock absorber 59 illustrated in FIG. 1A of the first example embodiment. Each of the shock absorber 259, the OLED substrate 257, the touch sensor 255, the optical polarizer 253, and the cover window 251 may be simply referred to as panel layer. The optical polarizer 253 and/or the touch sensor 255 may be omitted.

In FIG. 9, the upper surface of the cover window 251 corresponds to a viewing surface of the foldable display device 200. The cover window 251 includes a window film through which light emitted. The upper surface of the OLED substrate 257, to which the touch sensor 255 is bonded by the adhesive layer 256, corresponds to a light emitting surface (first surface) from which the light is emitted. The shock absorber 259 is located on a surface (second surface) opposite to the light emitting surface of the OLED substrate 257.

The layers of the cover window 251 to the display substrate 257 form a display panel 220. An additional lamination layer may be included between the OLED substrate 257 and the shock absorber 259, thereby adding rigidity to the OLED substrate 257.

Thus, the foldable display device 200 comprises a plurality of layers, the layers being bonded each other, the plurality of layers includes: a light emitting diode substrate layer; a cover window layer including a window film through which light from a first surface of the light emitting diode substrate layer is emitted; a shock-absorber layer located on a second surface of the light emitting diode substrate layer, the second surface being a surface opposite to the first surface. The additional lamination layer is bonded to the light emitting diode substrate layer, where the additional lamination layer is placed between the light emitting diode substrate layer and the shock-absorber layer. The plurality of layers may further includes a touch sensor layer between the light emitting diode substrate layer and the cover window layer. Also, the plurality of layers may further includes an optical polarizer layer placed between the light emitting diode substrate layer and the cover window layer.

Also, the foldable display device 200 of FIG. 9 may be folded, where the folded shape is the tear drop shape as explained with reference to FIG. 4. One or more housing members may be included in the foldable display device 200 as illustrated in FIG. 1A and FIG. 1B.

The structure of FIG. 9 is advantageous in a case where there is a considerable difference in bending stiffness between the OLED substrate 257 and the shock absorber 259. For example, the shock absorber 259 may contain a layer with considerably high Young's modulus in comparison to the additional lamination layer of the OLED substrate 257. More specifically, the shock absorber 259 may include a 30 µm stainless steel with E=200 GPa and a 50 µm thick PET lamination layer with E=3 GPa. In this case, the peeling pressure acting to delaminate the shock absorber 259 from the rest of the panel becomes high.

In order to reduce the peeling pressure at the additional lamination layer to the adhesive layer 258, which is put in the interface between the OLED substrate 257 and the shock absorber 259, the width of the shock absorber 259 is made slightly smaller than the width of the additional lamination layer, such that there is a border around the additional lamination layer where no shock absorber is bonded.

Thus, a dimension of the light emitting diode substrate layer measured along a folding axis is larger than a dimension of at least one layer included in the plurality of layers. In this case, the dimension of the light emitting diode substrate layer measured along a folding axis is larger than a dimension of the shock-absorber layer.

This structure advantageously decreases the peeling pressure at the shock absorber 259 to the interface between the additional lamination layer of the OLED substrate 257 and the shock absorber 259.

Meanwhile, the peeling pressures at the other interfaces in the display panel 220 are also increased. However the peeling pressures at the other interfaces are inherently lower due to the lower difference in bending stiffness between the additional lamination layer of the OLED substrate 257, OLED (e.g. polyimide with E=3 GPa) of the OLED substrate 257, touch sensor 255 (e.g. cyclic olefin polymer with E=2.5 GPa), optical polarizer 253 (e.g. PMMA with E=4 GPa) and window film (e.g. polyimide with E=7 GPa) of the cover window 251. Therefore, the foldable display device 200 with increased robustness against delamination is obtained.

Increasing the offset between the OLED substrate 257 and the shock absorber 259 advantageously decreases the peeling pressure to the interface between the additional lamination layer of the OLED substrate 257 and the shock absorber 259. However, the areas of the display which do not have a shock absorber 259 underneath will be less robust against an impact. Therefore, the choice of offset distance is a compromise between reducing risk of delamination and increasing resistance to impacts.

Preferably the offset between the OLED substrate 257 and the shock absorber 259 is in the range 0.1 mm to 2.0 mm. Thus, the dimension of the light emitting diode substrate layer measured along a folding axis is between 0.1 mm and 2.0 mm larger than the dimension of the at least one layer included in the plurality of layers.

More preferably, the offset between the OLED substrate 257 and the shock absorber 259 is in the range 0.5 mm and 1.0 mm. Thus, the dimension of the light emitting diode substrate layer measured along a folding axis is between 0.5 mm and 1.0 mm larger than the dimension of the at least one layer included in the plurality of layers.

Third Example Embodiment

Figure 10:
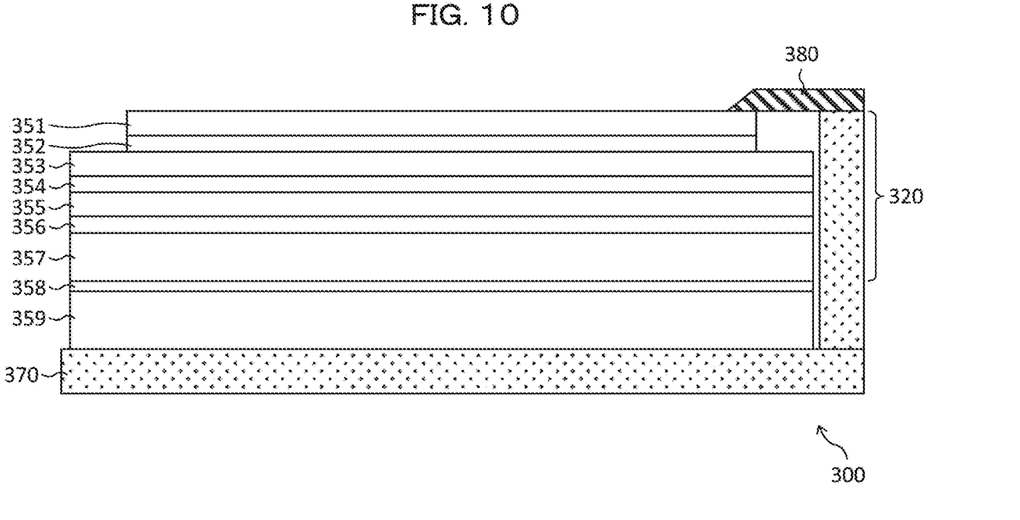
FIG. 10 is a drawing illustrating a cross-sectional view through a line parallel to the centerline of a foldable display device 300.

In this embodiment, a foldable display device 300, which has a smaller cover window, of this embodiment is described with reference to FIG. 10. FIG. 10 illustrates a cross-sectional view through a line parallel to the centerline of a foldable display device 300 according to the present disclosure.

The foldable display device 300 includes a display panel 320, and the foldable display device 300 can be folded, along the centerline, in the teardrop-shape. In FIG. 10, a length or width in a horizontal direction corresponds to a dimension measured along a folding axis of the foldable display device 300.

The line through which the cross-sectional view of FIG. 10 is obtained is placed in a non-folding region of the foldable display device 300. As explained with reference to FIG. 1A, the non-folding region of the foldable display device corresponds to the region covered by the housing member while the remaining region corresponds to the folding region. FIG. 10 illustrates the cross-section at one of the two non-folding regions of the foldable display device 300. A cross-section at the other non-folding region of the foldable display device 300 would be illustrated symmetrically.

A plurality of layers are stacked in the foldable display device 300 as shown in FIG. 10. The foldable display device 300 includes a cover window 351, an adhesive layer 352, an optical polarizer 353, an adhesive layer 354, a touch sensor 355, an adhesive layer 356, an OLED substrate 357, an adhesive layer 358 and a shock absorber 359. The cover window 351 to the shock absorber 359 respectively correspond to the cover window 51 to the shock absorber 59 illustrated in FIG. 1A of the first example embodiment. Each of the shock absorber 359, the OLED substrate 357, the touch sensor 355, the optical polarizer 353, and the cover window 351 may be simply referred to as panel layer. The optical polarizer 353 and/or the touch sensor 355 may be omitted.

In addition to the above described layers, the foldable display device 300 further includes a housing member 370 and a rubber bezel 380 as illustrated in FIG. 10.

In FIG. 10, the upper surface of the cover window 351 corresponds to a viewing surface of the foldable display device 300. The cover window 351 includes a window film through which light emitted. The upper surface of the OLED substrate 357, to which the touch sensor 355 is bonded by the adhesive layer 356, corresponds to a light emitting surface (first surface) from which the light is emitted. The shock absorber 359 is located on a surface (second surface) opposite to the light emitting surface of the OLED substrate 357.

The layers of the cover window 351 to the display substrate 357 form a display panel 320. An additional lamination layer may be included between the OLED substrate 357 and the shock absorber 359, thereby adding rigidity to the OLED substrate 357.

The structure of FIG. 10 is advantageous in a case where there is a considerable difference in bending stiffness between the cover window 351 and the optical polarizer 353. It is desirable that the window film included in the cover window 351 of the foldable display device 300 has high stiffness, thereby increasing the impact resistance of the foldable display device 300. In a foldable display device, the stiffness may be achieved by either using a thin layer of the window film with a high Young's modulus (e.g. 30 μm thick ultrathin glass with E=70 GPa) or a comparatively thick layer of the window film with a lower Young's modulus (e.g. 100 μm thick polyimide with E=7 GPa), which gives the window film that is still flexible enough to bend.

However, the higher stiffness compared to the adjacent optical polarizer 353 leads to a high peeling pressure between the window film of the cover window 351 and the optical polarizer 353, increasing the risk of the cover window 351 delaminating from the foldable display device 300.

In this embodiment, the width of cover window 351 including the window film is made smaller than the width of optical polarizer 353, for example by cutting it with a blade or laser prior to bonding. The smaller cover window 351 including the window film advantageously reduces the peeling pressure acting to debond the window film from the optical polarizer 353. Meanwhile, a size of cover window 351 including the window film is still large enough to cover the active area of the foldable display device 300.

The edge of the display panel 320, which is not covered by the cover window 351, may be covered by part of the housing member 370 for protection. Additionally the rubber bezel 380, for example, may surround the display panel 320, which also serves to prevent the ingress of dust into and behind the display panel 320.

In FIG. 10, the housing member 370 covers a lower surface of the shock absorber 359 as well as a right side edge of the shock absorber 359 and the display panel 320. Thus, the housing member 370 has a L-shape, which includes a vertical part and a horizontal part when viewing in this cross-section.

As shown in FIG. 10, the rubber bezel 380 is located on an upper surface of the cover window 351 and an upper surface of the vertical part of the housing member 370.

The rubber bezel 380 is connected to the housing member 370 of the foldable display device 300 and is not bonded to the window film of the cover window 351. The rubber bezel 380 extends over the surface of the cover window 351 to cover at least the offset between widths of the cover window 351 and the optical polarizer 353. In other words, the rubber bezel 380 covers a space between the cover window 351 with the adhesive layer 352 and the vertical part of the housing member 370 so that the ingress of dust into and behind the display panel 320 is prevented.

Thus, in the foldable display device 300, the dimension of the light emitting diode substrate layer measured along a folding axis is larger than a dimension of the cover window layer, and the foldable display device further comprises a rubber bezel extending over the surface of the cover window layer. The rubber bezel covers an offset between the light emitting diode substrate layer and the cover window layer, the rubber bezel being unbonded to the cover window layer.

Preferably, the offset between the optical polarizer 353 and the cover window 351 is in the range 0.1 mm to 2.0 mm. More preferably, the offset between the optical polarizer 353 and the cover window 351 is in the range 0.5 mm and 1.0 mm.

Fourth Example Embodiment

In the following, a fourth example embodiment according to the present disclosure is described with reference to the drawings.

In this embodiment, a foldable display device 400, which has a smaller shock absorber and a smaller cover window, is described with reference to FIG. 11 and FIG. 12.

Figure 11:
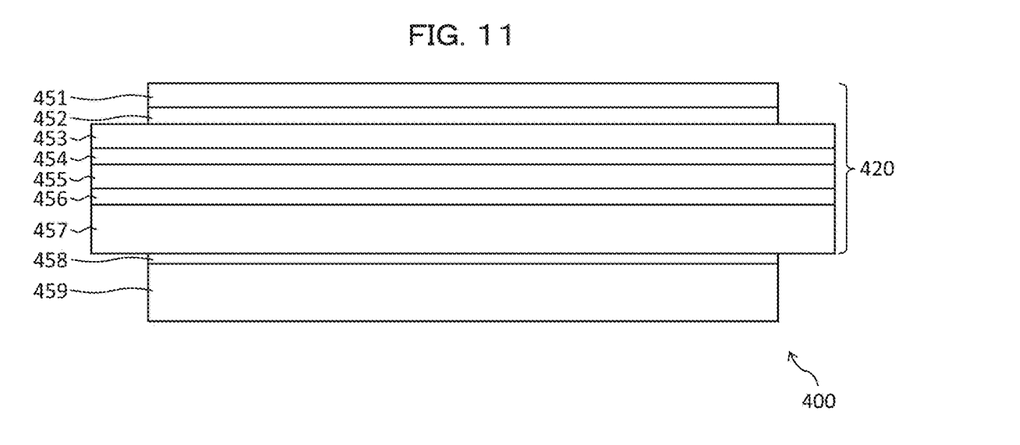
FIG. 11 is a drawing illustrating a cross-sectional view through a centerline of a foldable display device 400.

FIG. 11 illustrates a cross-sectional view through a centerline of the foldable display device 400 according to the present disclosure. The foldable display device 400 includes a display panel 420, and the foldable display device 400 can be folded, along the centerline, in the teardrop-shape. In FIG. 11, a length or width in a horizontal direction corresponds to a dimension measured along a folding axis of the foldable display device 400.

A plurality of layers are stacked in the foldable display device 400 as shown in FIG. 11. The foldable display device 400 includes a cover window 451, an adhesive layer 452, an optical polarizer 453, an adhesive layer 454, a touch sensor 455, an adhesive layer 456, an OLED substrate 457, an adhesive layer 458 and a shock absorber 459. The cover window 451 to the shock absorber 459 respectively correspond to the cover window 51 to the shock absorber 59 illustrated in FIG. 1A of the first example embodiment. Each of the shock absorber 459, the OLED substrate 457, the touch sensor 455, the optical polarizer 453, and the cover window 451 may be simply referred to as panel layer. The optical polarizer 453 and/or the touch sensor 455 may be omitted.

In FIG. 11, the upper surface of the cover window 451 corresponds to a viewing surface of the foldable display device 400. The cover window 451 includes a window film through which light emitted. The upper surface of the OLED substrate 457, to which the touch sensor 455 is bonded by the adhesive layer 456, corresponds to a light emitting surface (first surface) from which the light is emitted. The shock absorber 459 is located on a surface (second surface) opposite to the light emitting surface of the OLED substrate 457.

The layers of the cover window 451 to the display substrate 457 form a display panel 420. An additional lamination layer may be included between the OLED substrate 457 and the shock absorber 459, thereby adding rigidity to the OLED substrate 457.

In this example embodiment, the structures described in the second and third example embodiments are combined such that the both the shock absorber 459 and the cover window 451 are smaller than the other layers in the foldable display device 400, which are of almost equal width. As described in the second embodiment, the smaller shock absorber 459 advantageously decreases the peeling pressure at the shock absorber 459 to the interface between the additional lamination layer of the OLED substrate 457 and the shock absorber 459. Also, as described in the third embodiment, the smaller cover window 451 including the window film advantageously reduces the peeling pressure acting to debond the window film from the optical polarizer 453.

At the same time, as explained with reference to FIG. 7 and FIG. 8, a negative offset of the upper layer decreases the peeling pressure for the upper OCA but also increases the peeling pressure for the lower OCA, while a negative offset of the lower layer decreases the peeling pressure for the lower OCA but also increases the peeling pressure for the upper OCA. In this example embodiment, since the layers other than the shock absorber 459 and the cover window 451 are of almost equal width, these layers between the shock absorber 459 and the cover window 451 may collectively serve as the middle layer. The upper layer and the lower layer may respectively correspond to the cover window 451 and the shock absorber 459 while the upper OCA and the lower OCA may respectively correspond to the adhesive layer 452 and the adhesive layer 459.

The structure described with reference to FIG. 11 advantageously prevents the offset of the cover window 451 from significantly increasing the peeling pressure acting to debond the shock absorber 459 and, similarly, prevents the offset of the shock absorber 459 from significantly increasing the peeling pressure acting to debond the cover window 451. The offset of the shock absorber 459 and the cover window 451 need not be equal. A preferable offset of the shock absorber 459 and the cover window 451 may be defined as explained in the second and third example embodiments.

Figure 12:
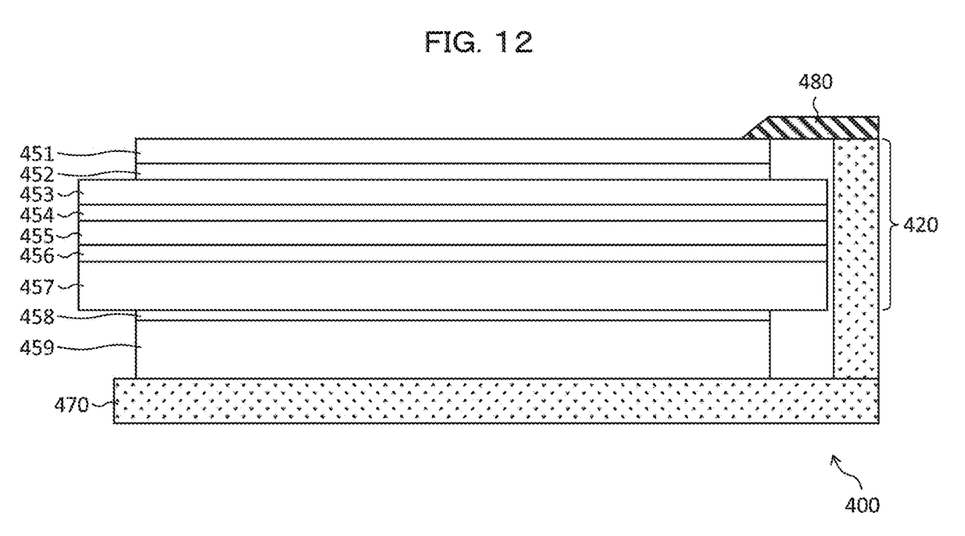
FIG. 12 is a drawing illustrating a cross-sectional view through a line parallel to the centerline of a foldable display device 400.

The foldable display device 400 may further include a housing member 470 and a rubber bezel 480 as illustrated in FIG. 12. FIG. 12 illustrates a cross-sectional view through a line parallel to the centerline of a foldable display device 400. In FIG. 12, a length or width in a horizontal direction corresponds to a dimension measured along a folding axis of the foldable display device 400.

The line through which the cross-sectional view of FIG. 12 is obtained is placed in a non-folding region of the foldable display device 300. As explained with reference to FIG. 1A, the non-folding region of the foldable display device corresponds to the region covered by the housing members while the remaining region corresponds to the folding region. FIG. 12 illustrates the cross-section at one of the two non-folding regions of the foldable display device 400. A cross-section at the other non-folding region of the foldable display device 400 would be illustrated symmetrically.

The edge of the display panel 420, which is not covered by the cover window 451, may be covered by part of the housing member 470 for protection. Additionally the rubber bezel 480, for example, may surround the display panel 420, which also serves to prevent the ingress of dust into and behind the display panel 420.

In FIG. 12, the housing member 470 covers a lower surface of the shock absorber 459 as well as a right side edge of the shock absorber 459 and the display panel 420. Thus, the housing member 470 has a L-shape, which includes a vertical part and a horizontal part when viewing in this cross-section. The offset between widths of the shock absorber 459 and the OLED substrate 457 is covered by the housing. Thus, the ingress of dust into and behind the display panel 420 from the space is prevented.

As shown in FIG. 12, the rubber bezel 480 is located on an upper surface of the cover window 451 and an upper surface of the vertical part of the housing member 470. The rubber bezel 480 extends over the surface of the cover window 451 to cover at least the offset between widths of the cover window 451 and the optical polarizer 453. In other words, the rubber bezel 480 covers a space between the cover window 451 with the adhesive layer 452 and the vertical part of the housing member 470 so that the ingress of dust into and behind the display panel 420 is prevented.

Fifth Example Embodiment

In this embodiment, variations of the layers in the foldable display device are described. It should be understood that the layers in the foldable display devices of the above described example embodiments may be combined. Also, a single function may be carried out by multiple layers in the foldable display devices of the above described example embodiments. For example, the touch sensor may be combined into the OLED substrate using on-cell or in-cell architectures. The shock absorber may have a multilayer structure, for example a 30 μm thick stainless steel layer bonded to a 100 μm layer of compressible acrylic foam.

ADDITIONAL REMARK

Although the present disclosure has been described with respect to a certain embodiment or embodiments, it is obvious that equivalent alterations and modifications will occur to others skilled in the art upon the reading and understanding of this specification and the annexed drawings. Furthermore, while the embodiment and the variations thereof have been described above taking as an example the OLED display device, the disclosure is not limited to the OLED display device and can be applied to any display devices, such as a display device including inorganic light-emitting diodes and quantum-dot light-emitting diodes (QLEDs).

(1) According to an aspect of the present disclosure, a foldable display device comprises a plurality of layers, the layers being bonded each other. The plurality of layers includes: a light emitting diode substrate layer; a cover window layer including a window film through which light emitted from a first surface of the light emitting diode substrate layer; a shock-absorber layer located on a second surface of the light emitting diode substrate layer, the second surface being a surface opposite to the first surface, wherein a dimension of the light emitting diode substrate layer measured along a folding axis is larger than a dimension of at least one layer included in the plurality of layers.

(2) According to another aspect of the present disclosure, the foldable display device according to the aspect (1) may be configured such that the dimension of the light emitting diode substrate layer measured along a folding axis is between 0.1 mm and 2.0 mm larger than the at least one layer.

(3) According to still another aspect of the present disclosure, the foldable display device according to the aspect (1) or (2) may be configured such that the dimension of the light emitting diode substrate layer measured along a folding axis is between 0.5 mm and 1.0 mm larger than the at least one layer.

(4) According to still another aspect of the present disclosure, the foldable display device according to any of the aspects (1) to (3) may be configured such that the dimension of the light emitting diode substrate layer measured along a folding axis is larger than a dimension of the shock-absorber layer.

(5) According to still another aspect of the present disclosure, the foldable display device according to any of the aspects (1) to (4) may be configured such that the dimension of the light emitting diode substrate layer measured along a folding axis is larger than a dimension of the cover window layer, and the foldable display device further comprises a rubber bezel extending over the surface of the cover window layer, wherein the rubber bezel covers an offset between the light emitting diode substrate layer and the cover window layer, the rubber bezel being unbonded to the cover window layer.

(6) According to still another aspect of the present disclosure, the foldable display device according to any of the aspects (1) to (5) may be configured such that an additional lamination layer is bonded to the light emitting diode substrate layer, the additional lamination layer being placed between the light emitting diode substrate layer and the shock-absorber layer.

(7) According to still another aspect of the present disclosure, the foldable display device according to any of the aspects (1) to (6) may be configured such that the plurality of layers further includes a touch sensor layer between the light emitting diode substrate layer and the cover window layer.

(8) According to still another aspect of the present disclosure, the foldable display device according to any of the aspects (1) to (7) may be configured such that the plurality of layers further includes an optical polarizer layer placed between the light emitting diode substrate layer and the cover window layer.

REFERENCE SIGNS LIST

100, 200, 300, 400 foldable display device
51, 251, 351, 451 cover window
52, 252, 352, 452 adhesive layer
53, 253, 353, 453 optical polarizer
54, 254, 354, 454 adhesive layer
55, 255, 355, 455 touch sensor
56, 256, 356, 456 adhesive layer
57, 257, 357, 457 OLED substrate
58, 258, 358, 458 adhesive layer
59, 259, 359, 459 shock absorber
70-1, 70-2 housing member
370, 470 housing member
380, 480 rubber bezel

The invention claimed is:

1. A foldable display device comprising a plurality of layers, the layers being bonded each other,
the plurality of layers including:
a light emitting diode substrate layer;
a cover window layer including a window film through which light from a first surface of the light emitting diode substrate layer is emitted;
a shock-absorber layer located on a second surface of the light emitting diode substrate layer, the second surface being a surface opposite to the first surface, wherein
a dimension of the light emitting diode substrate layer measured along a folding axis is larger than a dimension of at least one layer included in the plurality of layers.

2. The foldable display device according to claim 1, wherein
the dimension of the light emitting diode substrate layer measured along a folding axis is between 0.1 mm and 2.0 mm larger than the dimension of the at least one layer.

3. The foldable display device according to claim 1, wherein
the dimension of the light emitting diode substrate layer measured along a folding axis is between 0.5 mm and 1.0 mm larger than the dimension of the at least one layer.

4. The foldable display device according to claim 1, wherein
the dimension of the light emitting diode substrate layer measured along a folding axis is larger than a dimension of the shock-absorber layer.

5. The foldable display device according to claim 1, wherein the dimension of the light emitting diode substrate layer measured along a folding axis is larger than a dimension of the cover window layer, and the foldable display device further comprises a rubber bezel extending over the surface of the cover window layer, wherein the rubber bezel covers an offset between the light emitting diode substrate layer and the cover window layer, the rubber bezel being unbonded to the cover window layer.

6. The foldable display device according to claim 1, wherein an additional lamination layer is bonded to the light emitting diode substrate layer, the additional lamination layer being placed between the light emitting diode substrate layer and the shock-absorber layer.

7. The foldable display device according to claim 1, wherein the plurality of layers further includes a touch sensor layer between the light emitting diode substrate layer and the cover window layer.

8. The foldable display device according to claim 1, wherein the plurality of layers further includes an optical polarizer layer placed between the light emitting diode substrate layer and the cover window layer.

* * * * *